United States Patent
Baessler et al.

(10) Patent No.: US 9,722,627 B2
(45) Date of Patent: *Aug. 1, 2017

(54) DETECTION OF UNKNOWN CODE PAGE INDEXING TOKENS

(71) Applicant: International Business Machines Corporation, Armonk, NY (US)

(72) Inventors: Michael Baessler, Neckartenzlingen (DE); Thomas A. P. Hampp-Bahnmueller, Stuttgart (DE); Peng Hui Jiang, Beijing (CN)

(73) Assignee: International Business Machines Corporation, Armonk, NY (US)

( * ) Notice: Subject to any disclaimer, the term of this patent is extended or adjusted under 35 U.S.C. 154(b) by 40 days.

This patent is subject to a terminal disclaimer.

(21) Appl. No.: 14/823,431

(22) Filed: Aug. 11, 2015

(65) Prior Publication Data

US 2017/0048069 A1    Feb. 16, 2017

(51) Int. Cl.
H03M 7/34  (2006.01)
H03M 7/38  (2006.01)
H03M 7/00  (2006.01)
G06F 17/30  (2006.01)

(52) U.S. Cl.
CPC ......... *H03M 7/00* (2013.01); *G06F 17/30911* (2013.01)

(58) Field of Classification Search
CPC ............................... H04L 9/3234; H03M 7/00
USPC ............................................................ 726/9
See application file for complete search history.

(56) References Cited

U.S. PATENT DOCUMENTS

| | | | | |
|---|---|---|---|---|
| 3,492,646 A | * | 1/1970 | Bene | G06K 9/64 382/209 |
| 4,130,884 A | * | 12/1978 | Hildinger | B41J 5/51 400/63 |
| 5,335,016 A | * | 8/1994 | Nakagawa | H04N 5/772 348/220.1 |
| 7,191,114 B1 | * | 3/2007 | Murray | G06F 17/275 704/2 |
| 2007/0113143 A1 | | 5/2007 | Liao et al. | |

(Continued)

OTHER PUBLICATIONS

IBM: List of IBM Patents or Patent Applications Treated as Related (Appendix P), Jun. 14, 2016, pp. 1-2.

(Continued)

*Primary Examiner* — Dant Shaifer Harriman
(74) *Attorney, Agent, or Firm* — Samuel A. Waldbaum

(57) ABSTRACT

A method for determining an encoding used for a sequence of bytes may be provided. The method comprises providing a set of candidate code pages and transforming them into different groups of sequences of bytes, wherein each group of sequences of bytes corresponds to one of the candidate code pages. Thereby each code point is transformed by applying a transformation from one of the candidate code pages to a reference code point value relating to a reference encoding for each code point. The method comprises further separating each of the transformed sequences of bytes into groups of tokens, wherein each group of tokens relates to one candidate code page, and providing an index relating to a text corpus. Furthermore, the method comprises selecting a code page from the set of candidate code pages at least partially based on how many tokens are found in the index.

10 Claims, 7 Drawing Sheets

(56) References Cited

U.S. PATENT DOCUMENTS

2008/0244378 A1* 10/2008 Chen .................. G06K 9/00456
                                                          715/226
2009/0210412 A1    8/2009 Oliver et al.
2012/0254181 A1   10/2012 Schofield et al.
2017/0005674 A1*  1/2017 Hussain ............ H03M 13/2975

OTHER PUBLICATIONS

U.S. Appl. No. 15/166,498, filed May 27, 2016, entitled: "Detection of Unknown Code Page Indexing Tokens", pp. 1-41.
Burch, Presented for the Apache Foundation by the Linux Foundation, "What's with all the 1s and 0s? Making sense of binary data at scale with Apache Tika", Denver, Apr. 7-9, 2014, pp. 1-55.
Google Project Hosting, "Juniversalchardet", Printed on Jul. 28, 2015, https://code.google.com/p/juniversalchardet/, pp. 1-3.

* cited by examiner

DETECTION OF UNKNOWN CODE PAGE INDEXING TOKENS

BACKGROUND

The invention relates generally to a method for determining an encoding used for a sequence of bytes. The invention relates further to an encoding detection system for determining an encoding used for a sequence of bytes, and a related computer program product.

Since the beginning of the computer age, many encoding schemes for characters and symbols have been created to represent various writing scripts/characters for computerized data. With the advent of globalization and the development of the Internet, information exchanges, crossing both, language and regional boundaries are becoming ever more important. Beside Unicode, which is designated as the default encoding to provide convenient and unified communication, other different character sets or code pages co-exist for their own purpose. With a known code page or character set, information and content can be processed properly.

But there is still a big amount of content with unknown or incorrect code page or character set indicators. The value of these contents can be discovered when they are processed with the proper or right code page. There are several approaches available to detect the correct encoding for documents with unknown/incorrect encoding. They all have various strength and weaknesses. One family of approaches uses machine learning but requires training and has limited quality when it comes to detecting differences between related encodings. Other approaches are using dictionaries as a way to test every possible code page or character set for given code points. Although this is possible to find out an appropriate character set, it is expensive. In addition, for some multi-byte encodings such as EUC-CN and EUC-KR, they share almost identical coding points and it is very hard to distinguish among such encodings with this method.

There are several such families of code pages that differ for a small set of often rarely used characters (e.g., the family of the Latin encodings). While many algorithms exist that can identify code pages or character sets, they often only get the family of the code page correct but have systematic errors in finding the correct encoding down to the exact family member.

SUMMARY

It may be desirable to implement a method, system, and computer program product for detection of unknown code page indexing tokens.

In an embodiment of the present disclosure provides a method for detection of unknown code page indexing token. The method includes providing a set of candidate code pages adapted for decoding a sequence of bytes, where the sequence of bytes comprises one or more successions of digitally encoded characters. The method includes transforming the sequence of bytes into different groups of sequences of bytes based on the set of candidate code pages, where each code point within the sequences of bytes is transformed to a reference code point value relating to a reference encoding for each code point. The method includes separating each of the transformed sequences of bytes into groups of tokens, where the group of tokens relates to one candidate code page. The method includes providing an index relating to a text corpus, wherein the index comprises a set of tokens in said reference encoding. The method further includes selecting a code page within the set of candidate code pages at least partially based on the number of token relating to one of the set of candidate code pages is found in said index.

Another embodiment of the present disclosure provides a computer program product for detection of unknown code page indexing tokens. The computer program product includes providing a set of candidate code pages adapted for decoding a sequence of bytes, where the sequence of bytes comprises one or more successions of digitally encoded characters. The computer program product includes transforming the sequence of bytes into different groups of sequences of bytes based on the set of candidate code pages, where each code point within the sequences of bytes is transformed to a reference code point value relating to a reference encoding for each code point. The computer program product includes separating each of the transformed sequences of bytes into groups of tokens, where the group of tokens relates to one candidate code page. The computer program product includes providing an index relating to a text corpus, wherein the index comprises a set of tokens in said reference encoding. The computer program product further includes selecting a code page within the set of candidate code pages at least partially based on the number of token relating to one of the set of candidate code pages is found in said index.

Another embodiment of the present disclosure provides a computer system for detection of unknown code page indexing tokens. The computer system includes providing a set of candidate code pages adapted for decoding a sequence of bytes, where the sequence of bytes comprises one or more successions of digitally encoded characters. The computer system includes transforming the sequence of bytes into different groups of sequences of bytes based on the set of candidate code pages, where each code point within the sequences of bytes is transformed to a reference code point value relating to a reference encoding for each code point. The computer system includes separating each of the transformed sequences of bytes into groups of tokens, where the group of tokens relates to one candidate code page. The computer system includes providing an index relating to a text corpus, wherein the index comprises a set of tokens in said reference encoding. The computer system further includes selecting a code page within the set of candidate code pages at least partially based on the number of token relating to one of the set of candidate code pages is found in said index.

BRIEF DESCRIPTION OF THE SEVERAL VIEWS OF THE DRAWINGS

It should be noted that embodiments of the invention are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be disclosed within this document.

The aspects defined above and further aspects of the present invention are apparent from the examples of embodiments to be described hereinafter and are explained with reference to the examples of embodiments, but to which the invention is not limited.

Figure 1:
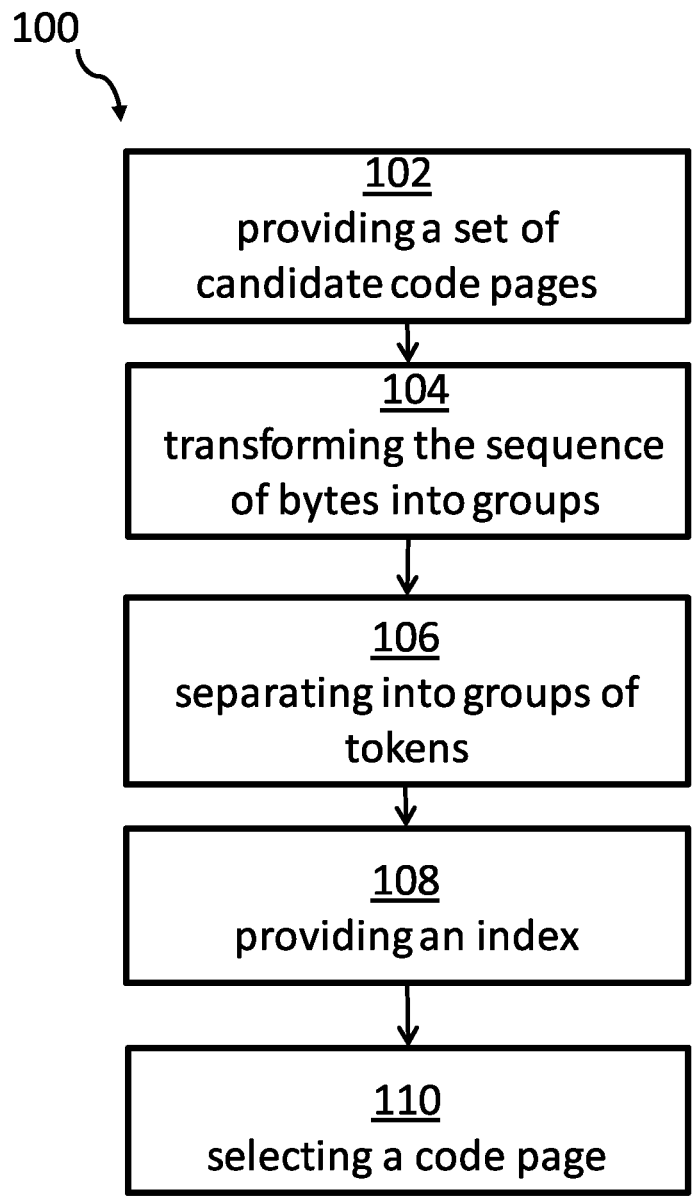

Preferred embodiments of the invention will be described, by way of example only, and with reference to the following drawings:

FIG. 1 shows a block diagram of an embodiment of the inventive method for determining an encoding used for a sequence of bytes.

Figure 2:
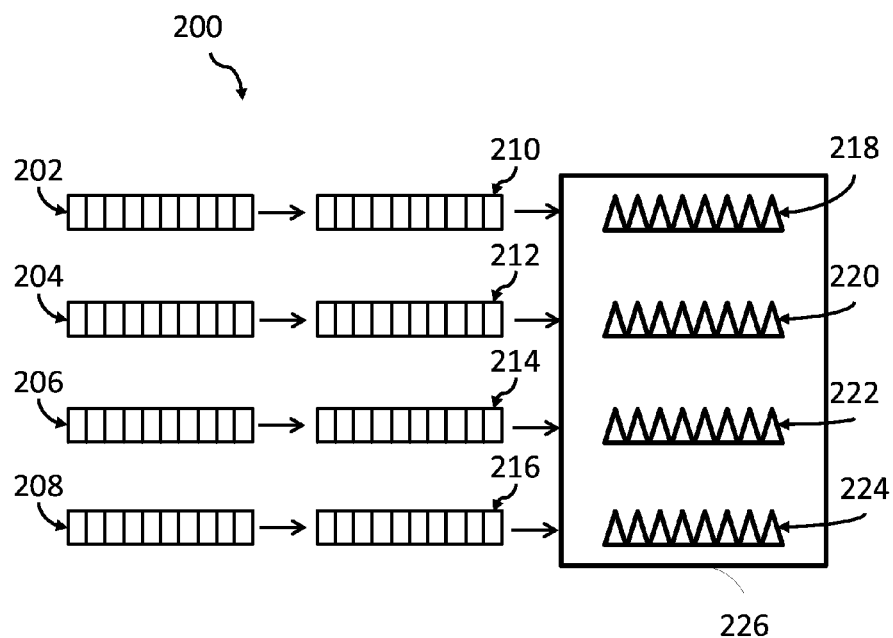

FIG. 2 shows a block diagram of an example of transformations of tokens.

Figure 3:
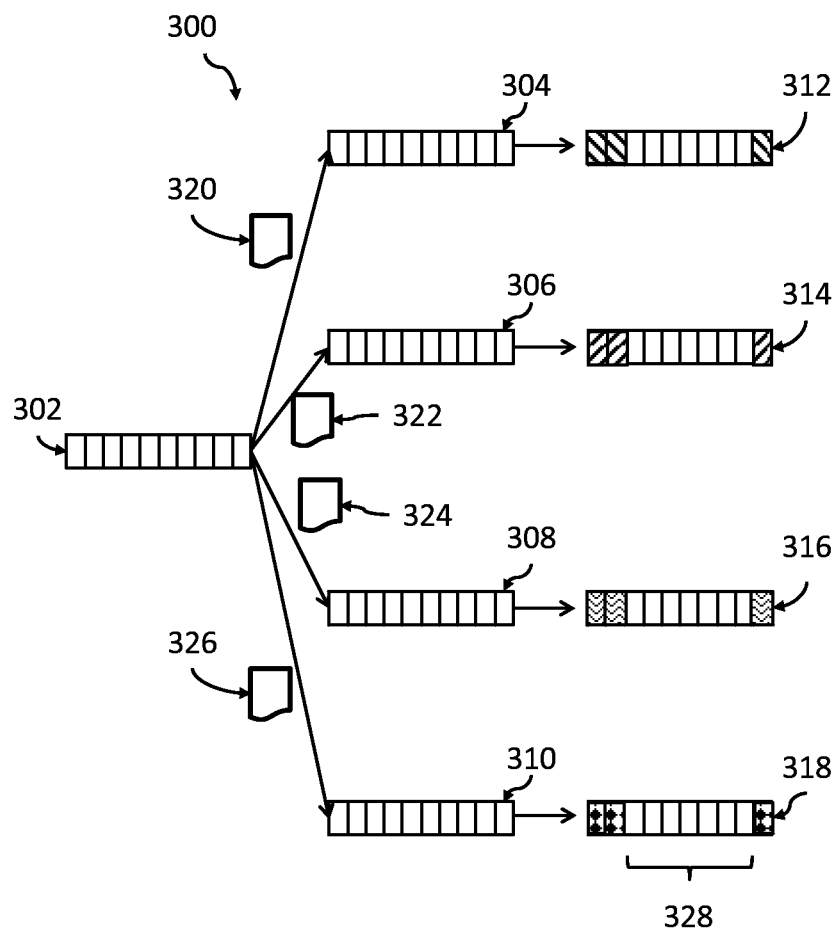

FIG. 3 shows a block diagram of an embodiment of a transformation of an incoming sequence of bytes.

Figure 4:
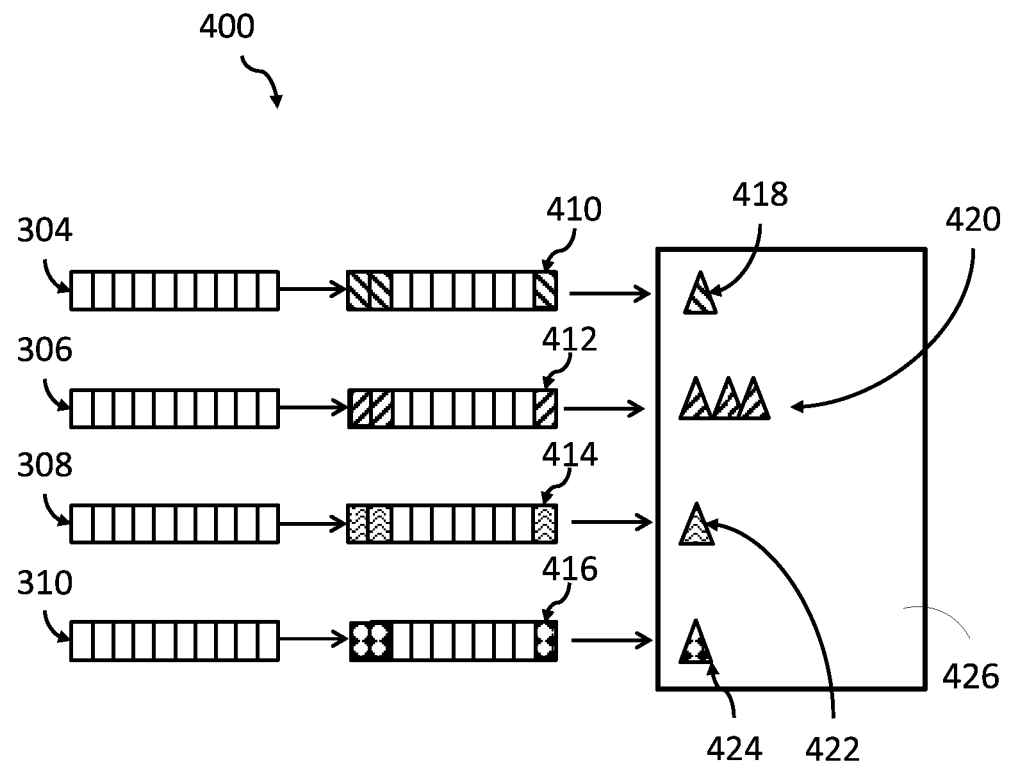

FIG. 4 shows a block diagram of an embodiment of identifying the correct code page.

Figure 5:
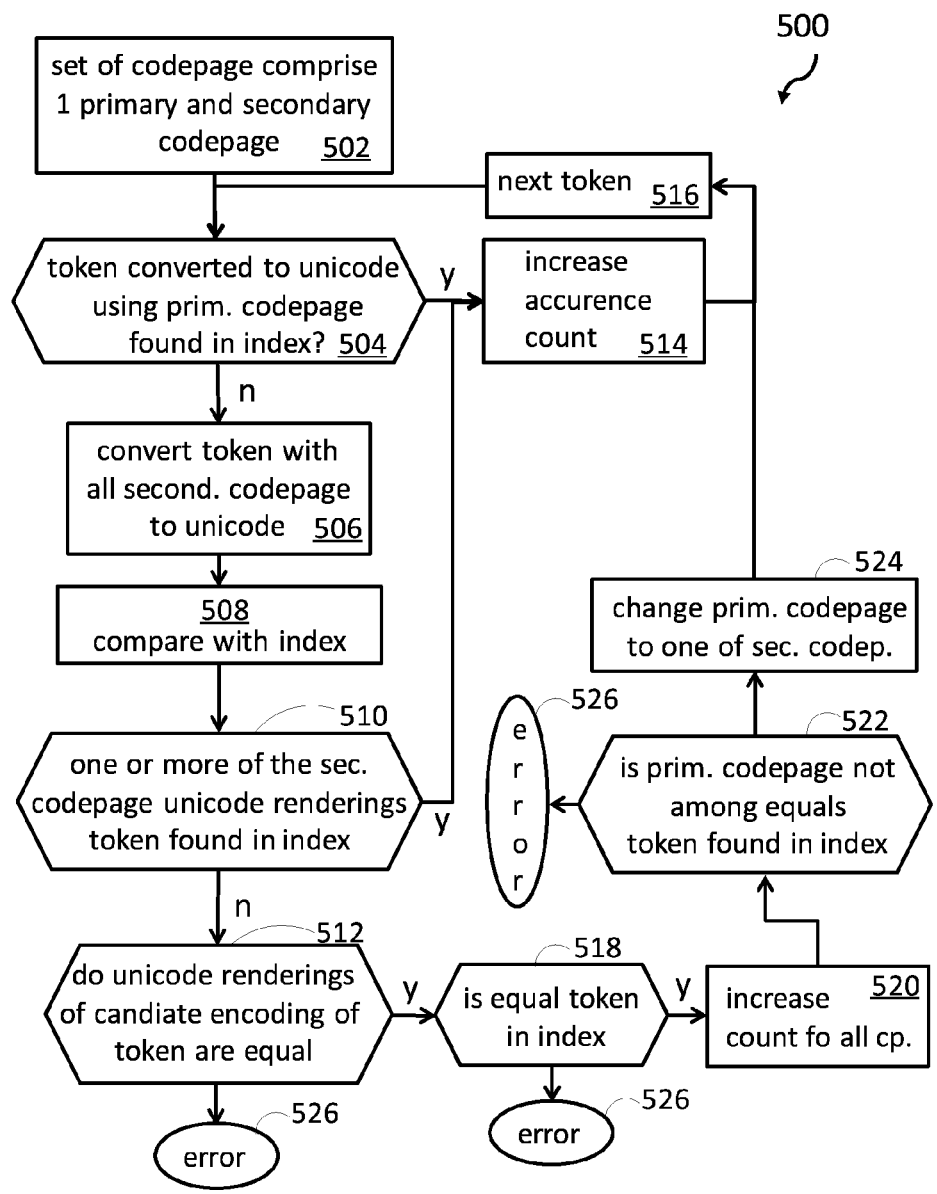

FIG. 5 shows a flow diagram of an alternative method for determining encoding used for a sequence of bytes.

Figure 6:
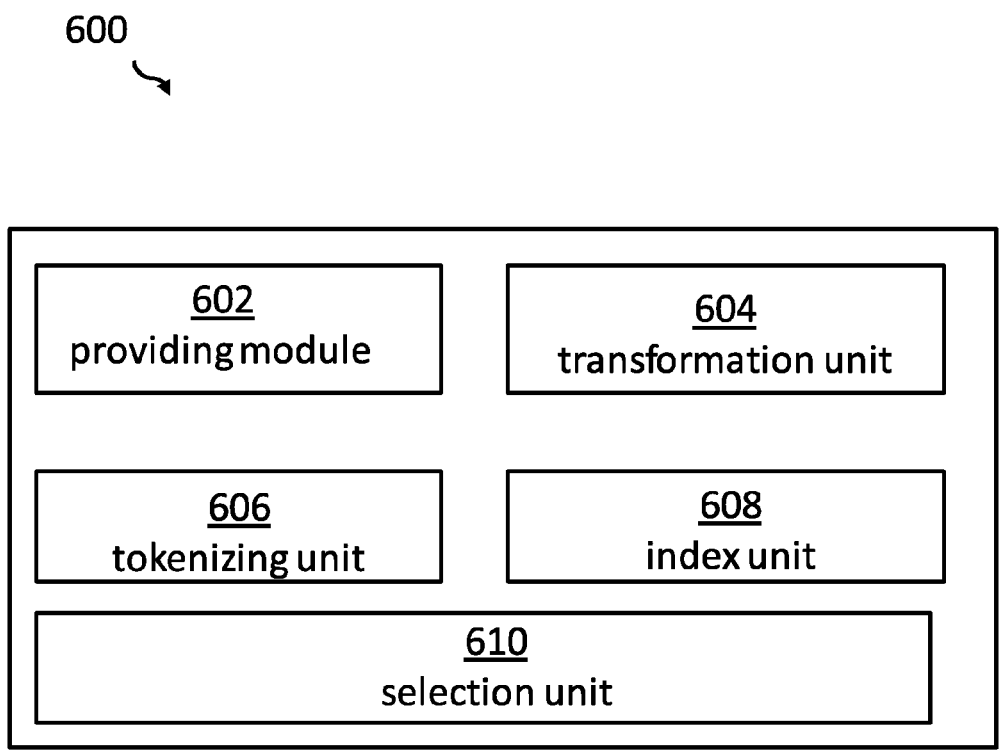

FIG. 6 shows an embodiment of the encoding detection system.

Figure 7:
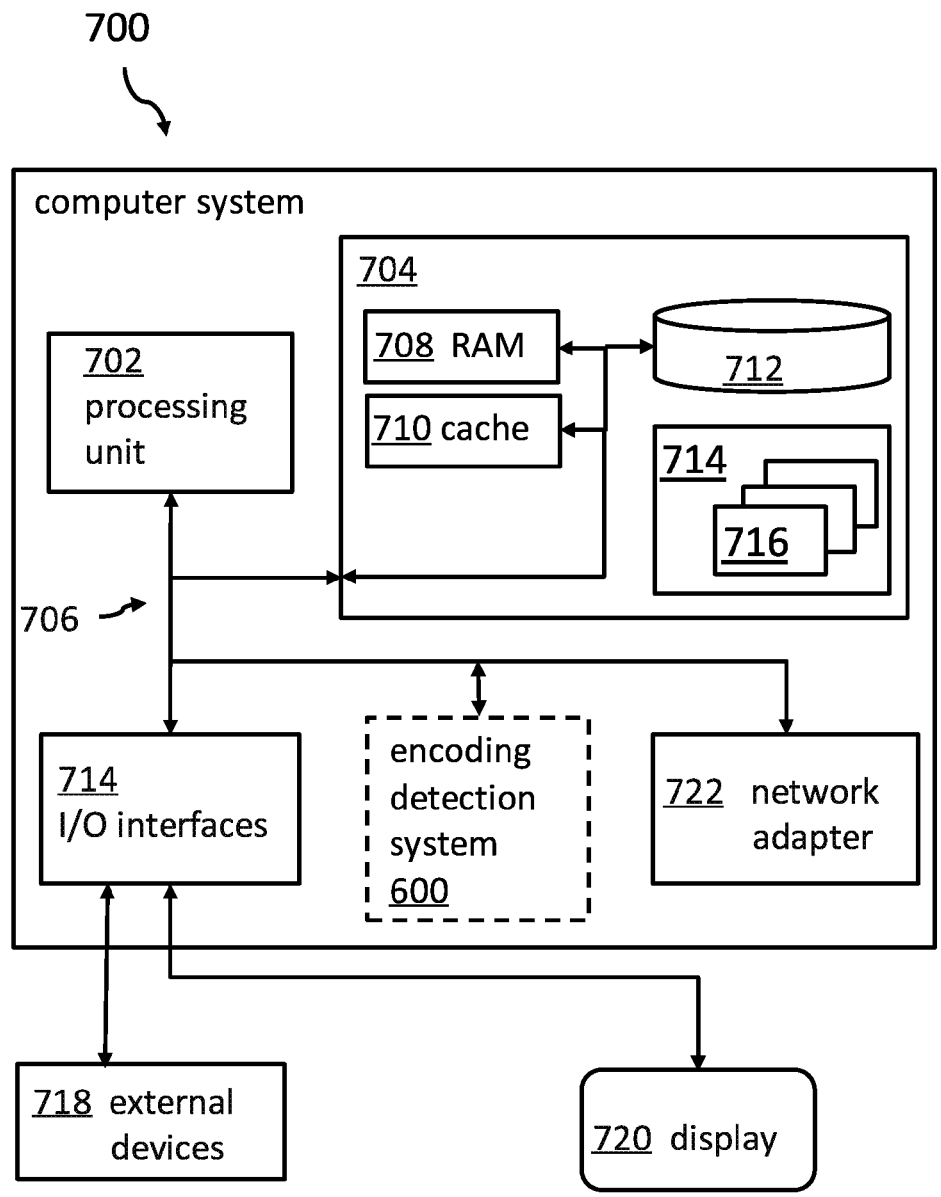

FIG. 7 shows an embodiment of a computer comprising the encoding detection system.

DETAILED DESCRIPTION

In the context of this description, the following conventions, terms and/or expressions may be used:

The term "encoding" may denote a transformation of a naturally readable character or symbol, e.g. a byte or double byte, into its digital equivalents. For such a transformation, a code page is used, which may be seen as a table of values that describes the character set used for encoding a particular set of glyphs, usually combined with a number of control characters. The term "code page" originated from IBM's EBCDIC-based mainframe systems (Extended Binary Coded Decimals Interchange Code), is used by the majority of information technology vendors and a skilled person is used to it. Information technology vendors often allocate their own code page number to a character encoding, even if it is better known by another name (e.g., UTF-8 [Unicode Transformation Format] character encoding has code page numbers 1208 at IBM, 65001 at Microsoft, 4110 at SAP). IBM introduced the concept of systematically assigning a small, but globally unique, 16 bit number to each character encoding that a computer system or collection of computer systems might encounter. Another well-known encoding scheme is the extended ASCII encoding as used in its PC hardware. As another example, the simple 7-bit ASCII code (American Standard Code for Information Interchange) representing 128 control codes and printable characters.

A well-known encoding standard is the Unicode. Unicode is a computing industry standard for the consistent encoding, representation, and handling of text expressed in most of the world's writing systems. Developed in conjunction with the Universal Character Set standard and published as 'The Unicode Standard', the latest version of Unicode contains a repertoire of more than 110,000 characters covering 100 scripts and multiple symbol sets. The standard consists of a set of code charts for visual reference, an encoding method and set of standard character encodings, a set of reference data files, and a number of related items, such as character properties, rules for normalization, decomposition, collation, rendering, and bidirectional display order (for the correct display of text containing both, right-to-left scripts such as Arabic and Hebrew, and left-to-right scripts). As of June 2014, the most recent version is Unicode 7.0. The standard is maintained by the Unicode Consortium.

The term "sequence of bytes" may denote any sequence or any succession of digitally encoded characters or symbols. The sequence of bytes may also be seen as a sequence of character in a document. To be stored digitally, the human readable characters are encoded in one or more bytes using a code page. To become human readable again, the sequence of bytes in the form of a bit-stream need to be decoded first in order to transform them into human readable or printable characters. The sequence of bytes may be transformed into a human readable form by using a code page. It may be clear that for a readable text the sequence of bytes may also be interpreted as a text.

The term "code point" may denote a series of bits which may be assumed to represent a human readable character which may be equivalent to an encoding/decoding field in a given code page. A code point may be a byte or two bytes but is not limited to this format.

The term "tokens" may denote basically a word of a language. Typically, words are delimited by special characters, e.g., space, blank characters or simply blanks. A bitstream or, in this case, a sequence of—in particular, unknown—characters, may be separated into tokens by traditional technologies, e.g., white space analysis. This may be performed by a tokenization unit.

The term "text corpus" may denote a group of words or tokens potentially stored together with these data. The text corpus may, e.g., be stored as an index file of, e.g., an operating system or file management system. In this case, the index may list and store words and expressions or symbols found in stored documents using known code pages. The metadata of the word may, e.g., be information about the fact where the word, i.e., in which document or file a file management system, may have found that particular word. Thus, each word in the index may be stored once but with additional data comprising the location and/or document the word has been found.

The term "code page family" may denote a group of code pages having similar characteristics, e.g., encode and decode most of the characters in a code page of the code page family to an identical human readable or printable character.

The proposed method for determining encoding used for a sequence of bytes may offer a couple of advantages and technical effects:

The proposed method and the related encoding detection system focus on using code points which may be understood as a sequence of bytes—in general, a sequence of bits—to transform them into human readable characters and/or symbols. A dedicated and specific dictionary for comparing potentially found words in an unknown sequence of bytes may not be required. Instead, an index file or another information storage storing an index may be used that may be available a priori, e.g., as part of an operating system or a file management system or a content management system. I.e., the index file of the file management system can be used as part of the proposed method. The index file holds information about which words and/or expressions may be found in files, the file management system is handling anyway. Thus, a dedicated dictionary may not be required. The file system index may be complete with up to date information based on all documents stored in the file system. Thus, the index is updating itself permanently. No effort for maintaining a dedicated dictionary may be required.

Additionally, the method may be more accurate than traditional technologies because it is based on processed, known and isolatable code points instead of complete words, i.e. tokens, as a starting point.

It may also be reflected that for a limited number of unknown texts, code page detection may be performed manually or in another manner using traditional technologies. However, large companies receive hundreds, several hundred thousand, or sometimes millions of emails today. Assumed that many or most of the emails may not be received with correct code page information, the huge effort to relate the incoming emails to the correct code pages may become an unmanageable task. Thus, an automatic and very efficient way for detection of the correct code page for a given incoming bit stream—in particular in form of emails and/or attachments—in order to interpret the bit stream is required. The present disclosure allows consuming limited computing resources and reusing already available information and form of the index of the file system or from another existing system suitable for a token comparison.

In the following, a detailed description of the figures will be given. All instructions in the figures are schematic. Firstly, a block diagram of an embodiment of the inventive method for determining encoding used for a sequence of bytes is given. Afterwards, further embodiments as well as embodiments of the encoding detection system for determining encoding used for a sequence of bytes is described.

According to one aspect of the present invention, a method for determining an encoding used for a sequence of bytes may be provided. The method may comprise providing a set of candidate code pages for decoding the sequence of bytes and transforming the sequence of bytes into different groups of sequences of bytes by using the set of candidate code pages. Thereby, each group of sequences of bytes may correspond to one out of the set of candidate code pages. Additionally, each code point of one of the sequences of bytes may be transformed by applying a transformation from one out of the set of candidate code pages to a reference code point value relating to a reference encoding for each code point.

Moreover, the method may comprise separating each of the transformed sequences of bytes into groups of tokens, wherein each group of tokens relates to one candidate code page, and providing an index relating to a text corpus, wherein the index comprises a set of tokens in the reference encoding, as well as selecting a code page from the set of candidate code pages at least partially based on how many tokens in a group of tokens relating to one of the set of candidate code pages are found in the index.

According to another aspect of the present invention, an encoding detection system for determining encoding used for a sequence of bytes may be provided. The encoding detection system may comprise a providing module adapted for providing a set of code pages adapted for encoding the sequence of bytes, and a transformation unit adapted for transforming the sequence of bytes into different groups of sequences of bytes by using the set of candidate code pages, wherein each group of sequences of bytes corresponds to one out of the set of candidate code pages, and wherein each code point of one of the sequences of bytes is transformed by applying a transformation from one out of the set of candidate code pages to a reference code point value relating to a reference encoding for each code point.

Additionally, the encoding detection system may comprise a tokenization unit which may be adapted for separating each of the transformed sequences of bytes into groups of tokens wherein each group of tokens relates to one candidate code page, an index unit which may be relating to a text corpus, wherein the index comprises a set of tokens in the reference encoding, and a selection unit adapted for selecting a code page from the set of candidate code pages at least partially based on how many tokens in a group of tokens relating to one of the set of candidate code pages are found in the index.

Furthermore, embodiments may take the form of a related computer program product, accessible from a computer-usable or computer-readable medium providing program code for use, by or in connection with a computer or any instruction execution system. For the purpose of this description, a computer-usable or computer-readable medium may be any apparatus that may contain means for storing, communicating, propagating or transporting the program for use, by or in a connection with the instruction execution system, apparatus, or device.

FIG. 1 shows a block diagram of an embodiment of the method 100 for determining an encoding used for a sequence of bytes. At 102 the method 100 may provide a set of candidate code pages adapted for decoding the sequence of bytes. The preselection for the code page may be made as explained above.

At 104, the method 100 may transform the sequence of bytes into different groups of sequences of bytes by using the set of candidate code pages, wherein each group of sequences of bytes corresponds to one out of the set of candidate code pages, and wherein each code point—assuming that the code points correspond to assumed characters—of one of the sequences of bytes may be transformed by applying a transformation from one out of the set of candidate code pages to a reference code point value relating to a reference encoding for each code point. The reference encoding may (e.g., be the Unicode code page).

At 106, the method 100 may separate each of the transformed sequences of bytes into groups of tokens. This may be performed by conventional technologies, e.g., using white space analysis. Each group of tokens may relate to one candidate code page.

At 108, the method 100 may provide an index relating to a text corpus. This may not be a classical dictionary which may have to be maintained separately. Instead, a priori available indexes, e.g., used by an operating system or file management system which may index files anyway as part of the normal operation of the file management system. The index may comprise a set of tokens in the reference encoding.

At 110 the method 100 may select a code page from the set of candidate code pages at least partially based on how many tokens in a group of tokens relating to one of the set of candidate code pages maybe found in the index. Using this technology, the probability for having found the appropriate code page is relatively high and completely independent from human interventions. The code page may be detected by the computer automatically. This hold true also for volumes which may be impossible to handle for humans.

According to one preferred embodiment of the method, in the selecting a code page that code page of the set of candidate code pages is selected which group of tokens produces a maximum number of matches between the group of tokens and the index. It is assumed that this so selected code page has the highest probability to be a viable code page from decoding the sequence of characters/stream of bytes accordingly. A threshold may be defined how many hits a comparison between the token in the reference code and the index may have been produced before it is assumed that the found code page represents the right code page meaning the code page that has been used to encode the original text.

According to an embodiment of the method, members of the set of candidate code pages are chosen based on at least one out of the group comprising: a detected code page family, a frequently used code page, a code page of a used operating system, a code page used before by a same originator of the sequence of bytes, a code page of a comparable sequence of bytes. Other preliminary or candidate code pages may be used based on information about meta-data of the document comprising the unknown sequence of bytes, a file extension, the size of the initial document, same starting sequence of code points, etc.

According to an embodiment of the method, the providing the set of candidate code pages comprises using candidate code pages from a same code page family. Because of the limited differences of code pages of the same code page family, it becomes pretty probable to identify the correct original code page. Additionally, a detection of code page family is easier than an (unknown) code page itself.

According to an embodiment of the method, those tokens are compared to the index that are different in a same position relative to a beginning of each of the groups of tokens if the groups of tokens are compared. This may ensure that corresponding tokens in the group of tokens are set into relationship to each other. If corresponding tokens in the different group of tokens in the just defined sense are identical, a probability to find them in the index may be relatively high. Therefore, a comparison may be omitted. Thus, those corresponding tokens showing differences to each other may be compared with the index. If these tokens are not found in the readily available, standby index, the probability is relatively high that the used code page to decode the code points of these tokens is not a correct one.

According to another embodiment of the method, those tokens that are equal in a same position relative to a beginning of each of the group of tokens if the groups of tokens are compared to each other, are committed to the index. Committing a token to the index may not denote that the token may be added to the index but that the metadata of the token within the index may be enriched; e.g., metadata may be added indicating in which document the token has been found.

According to an embodiment of the method, a predefined number of tokens in each of the groups of tokens may be used for the selection of the code page. A threshold value may be defined for the predefined number. Also comparisons based on the percentage of found tokens in the index may be used. With this, the search for the correct code page may be interrupted and it may be determined that the code page with the so far highest probability would be used as the selected code page.

According to an additional embodiment of the method, the selection of the code page may comprise using that candidate code page corresponding to that group of tokens which code point values in the reference encoding belong all to a same character block, and terminating the selecting the code page. This may be a shortened version of the proposed method based on his sanity or consistency check and common sense. If more transformed code points result in code points belonging to the same character block within the code page the probability may be relatively high that this candidate code page may be the correct one. Thus, the further execution of the method may be stopped. This may also be based on a threshold number of code point values that have successfully been identified to belong to one character block of the given code page.

According to one additional, embodiment of the method the providing a set of candidate code pages comprises providing a primary candidate code page and one or more secondary candidate code pages. Thereby, in the transforming the sequence of bytes into different groups of sequences of bytes by using the set of candidate code pages, the set of code pages is limited to the primary candidate code page. This means that at this stage none of the secondary candidate code pages are used. In case in the selecting a code page from the set of candidate code pages the primary code page is selected because a respective token is found in the index, an occurrence count is increased. This may be an equivalent to saying that the token was committed to the index. It may be noted that all tokens and all documents or files which are part of the file system may get a respective metadata information that a specific token or word has been found in a specific document. This may also apply to tokens as part of the here proposed method for detecting a code page.

According to one further embodiment of the method, in case in the selecting a code page from the set of candidate code pages the primary code page is not selected because a respective token was not found in the index, the set of code pages is limited to the secondary code pages. This means that now all Unicode transformations starting with the assumed secondary candidate code pages are performed. This may allow to continue with a processing as follows:

If one or more secondary code pages result in a Unicode rendering token that occurs in the index that encoding may be used for the given token and that Unicode rendering may also be committed to the index, which may be equivalent to increasing the occurrence count—expounding the metadata—of the token in the index. If neither, primary nor the secondary code pages result in a token that is in the index, it is checked at several of the candidate code pages reside in the same Unicode rendering. If more than N (configurable) of the candidate code pages reside in the same Unicode rendering then the token is assumed to be correctly decoded and the Unicode rendering is committed to the index. If the primary code page was not among the set of encodings that resided in the same Unicode rendering, the primary code page for future tokens may be switched to be one of the candidates that resided in the same Unicode rendering.

It may also be possible to use this part of the method if an index may not be available initially. With this part of the method, the index may be served and grown over time.

This approach may limit how much memory and conversion or transformations have to be tried. If the primary candidate code page happens to be the correct code page, no alternative candidate code page decoding may be tried if all the tokens are in the index already. It may also be noted that traditional encoding detection may be used to determine which encoding code pages should be in the candidate code page set in which one should be the primary code page initially. It may be advantageous to use the one with the highest confidence or probability. This approach will be further discussed in the context of FIG. 5.

FIG. 2 shows a block diagram of an example 200 of transformations of tokens if a known encoding for an encoded sequence of bytes is used. Each small box in the sequence of bytes 202, 204, 206, 208 may represent a token. Each token may be a group or sequence of code points. Each code point is assumed to represent a character. If the code pages of the different representations code points or group of bytes are known, a transformation of the code points from the known encoding or code page to corresponding an encoding in a reference code page, e.g., Unicode, all tokens 210, 212, 214, 216 appear identical. A comparison with entries in an index 226 results in identical hits in the index. All tokens are found in the index. In the language of FIG. 2: all rectangular boxes representing a token (but different) relate each to one token 218, 220, 222, 224 in the index.

FIG. 3 shows a block diagram of an embodiment 300 of a transformation of an incoming sequence of bytes in form of a bit-stream 302 which may—after the transformation—result in different tokens in the group of tokens 312, 314, 316, 318.

Initially, it may be unknown which code page may have been used to produce the tokens in the group of tokens 302. Again, each small rectangular box may represent a token. A set of candidate code pages 320, 322, 324, 326 may be selected applying one of the above-defined selection options. Applying these candidate code pages to the original bit-stream or sequence of bytes 302, four different groups of tokens 304, 306, 308, 310 may be generated. However, it may still be unknown whether one of the candidate code pages 320, 322, 324, 326 is the one that has been used to encode the original token comprising the original code points into the incoming bit-stream or sequence of bytes 302.

After transformation from the group of characters 304, 306, 308, 310 from and encoding in the candidate code page two Unicode groups of tokens 312, 314, 316 and 318 it suddenly appears that different tokens in the different groups of tokens 312, 314, 316 and 318 appear differently, as indicated by the different marks on the tokens, which are presented as small rectangular boxes within the larger group of tokens 312, 314, 316 and 318.

By way of example, the groups of tokens 312, 314, 316, 318 comprise eight tokens each. It can be seen from FIG. 3 that the tokens with a number 3 to 7 (compare 328) are equal if compared from group to group. The first and second token as well as the $8^{th}$ token is represented with a different marking. For the identical resulting tokens 328, it may not be required to compare them with the index because the probability is relatively high that these tokens may be found in the index. However, it may still be required to determine which of the candidate code pages 320, 322, 324, 326 may be the one that has been used to encode the original characters into digital format in the first place. For those, the next figure may be instrumental.

FIG. 4 shows a block diagram 400 of an embodiment of identifying or selecting the correct code page. Again, for the groups of tokens 304, 306, 308, 310, the candidate code pages are shown as well to transform related tokens into Unicode 312, 314, 316, 318 (reference numbers not shown in FIG. 4).

Comparing the tokens 410, 412, 414, 416 and those with the same marking (reference sign not used to space constraints in the figure) it turns out, that only one out of the token group 304 in transformed form is found in the index, compared 418. The same applies to the tokens 422 and 424. Only one of the respective three different tokens among the groups can be found in the index. However, the second group of tokens 306 assumed to be encoded with a code page 322 results in three hits 420 during a comparison with the index 426. Thus, code page 322 is "the winner". Hence, in this example the code page 322 relating to the group of tokens 306 will be selected.

FIG. 5 shows an alternative embodiment 500 for detecting a code page. In this embodiment, the preliminary set of code pages comprises a primary and one or more secondary code pages, block 502. In step or block 504, it may be determined whether a token converted or transformed to Unicode using the primary code page may be found in the index. In case of "yes", 514, same test may be performed with the next token, block 516. In case of "no", the token may be converted to Unicode using the one or more secondary code pages, block 506. The results may be compared with the index, at block 508. If one or more of the secondary code page Unicode renderings find the token in the index—block 510, case "yes"—the occurrence count of the token is increased, block 514, and the same procedure may be performed with the next token, block 516.

In case of "no" in block 510, it may be checked whether the Unicode renderings of the secondary code page candidates generate tokens that are equal if the different Unicode renderings are compared with each other, block 512. Next—case "yes", block 512—it is checked, whether such a token may be found in the index. If in block 512 or block 518 the determination results with a "no", an error message may be generated (error box 526).

If an identical or equal token may be found in the index—case "yes", block 518—the occurrence count may be increased for all code pages, block 520. This means that in the index metadata may be added indicating that the token has been found when using all the secondary candidate code pages. In case the primary code page was not among the code pages with the equal token that has been found in the code page—block 522, case "no"—the primary code page and coding for future tokens may be switched to be one of the secondary candidate code pages that resulted in the same Unicode rendering, block 524. The processing may continue with the next token in one of the secondary candidate code pages in block 516 until all tokens have been processed or a stop condition has been reached—e.g., a predefined number of tokens has been processed.

Also the following comments may be viewed in light of FIG. 5. In the case, in which each candidate code page is checked against the index, one may keep track which of the code pages resulted in an index hit. Over several tokens, one may keep track of index hit counts for each candidate code page. Thereby, an index hit for two different candidate code pages may happen for two different reasons: either because they reside in the same token which is in the index or because they reside in different tokens which of those are in the index. At this point it may be unclear in that case which code page is the correct one; but each code page may get assigned in additional index hit counts. That way code pages that reside in more index hits gain a higher index hit count as more and more tokens are checked. An index hit count threshold may be defined which may be either just an absolute number or a relative distance between top scoring candidate and second scoring candidate code pages. When that index hit count threshold may be reached, then the top scoring candidate code page may be assumed to be the correct code page and the processing for the rest of the sequence of bytes in the described token-by-token mode may be skipped. The remaining part of the sequence of bytes in the document may be decoded in one piece simply using the determined "winner" encoding or "winner" code page.

FIG. 6 shows an embodiment of the encoding detection system 600. The encoding detection system may comprise a providing module 602 adapted for providing a set of code pages adapted for encoding the sequence of bytes and a transformation unit 604 adapted for transforming the sequence of bytes into different groups of sequences of bytes by using the set of candidate code pages. Each group of sequences of bytes corresponds to one out of the set of candidate code pages. Each code point of one of the sequences of bytes is transformed by applying a transformation from one out of the set of candidate code pages to a reference code point value relating to a reference encoding for each code point.

Furthermore, the encoding detection system may comprise a tokenization unit 606 adapted for separating each of the transformed sequences of bytes into groups of tokens wherein each group of tokens relates to one candidate code page and an index unit 608 relating to a text corpus, wherein the index comprises a set of tokens in the reference encoding.

Furthermore, the encoding detection system comprises a selection unit 610 adapted for selecting a code page from the set of candidate code pages at least partially based on how many tokens in a group of tokens relating to one of the set of candidate code pages are found in the index.

Such an encoding detection system 600 may also be implemented as part of a computer system as discussed in the following.

Embodiments of the invention may be implemented together with virtually any type of computer, regardless of the platform being suitable for storing and/or executing program code. FIG. 7 shows, as an example, a computing system 700 suitable for executing program code related to the proposed method.

The computing system 700 is only one example of a suitable computer system and is not intended to suggest any limitation as to the scope of use or functionality of embodiments of the invention described herein. Regardless, computer system 700 is capable of being implemented and/or performing any of the functionality set forth hereinabove. In the computer system 700, there are components, which are operational with numerous other general purpose or special purpose computing system environments or configurations. Examples of well-known computing systems, environments, and/or configurations that may be suitable for use with computer system/server 700 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like. Computer system/server 700 may be described in the general context of computer system-executable instructions, such as program modules, being executed by a computer system 700. Generally, program modules may include routines, programs, objects, components, logic, data structures, and so on that perform particular tasks or implement particular abstract data types. Computer system/server 700 may be practiced in distributed cloud computing environments where tasks are performed by remote processing devices that are linked through a communications network. In a distributed cloud computing environment, program modules may be located in both local and remote computer system storage media including memory storage devices.

As shown in the figure, computer system/server 700 is shown in the form of a general-purpose computing device. The components of computer system/server 700 may include, but are not limited to, one or more processors or processing units 702, a system memory 704, and a bus 706 that couples various system components including system memory 704 to the processor 702. Bus 706 represents one or more of any of several types of bus structures, including a memory bus 706 or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus. Computer system/server 700 typically includes a variety of computer system readable media. Such media may be any available media that is accessible by computer system/server 700, and it includes both, volatile and non-volatile media, removable and non-removable media.

The system memory 704 may include computer system readable media in the form of volatile memory, such as random access memory (RAM) 708 and/or cache memory 710. Computer system/server 700 may further include other removable/non-removable, volatile/non-volatile computer system storage media. By way of example only, storage system 712 may be provided for reading from and writing to a non-removable, non-volatile magnetic media (not shown and typically called a 'hard drive'). Although not shown, a magnetic disk drive for reading from and writing to a removable, non-volatile magnetic disk (e.g., a 'floppy disk'), and an optical disk drive for reading from or writing to a removable, non-volatile optical disk such as a CD-ROM, DVD-ROM or other optical media may be provided. In such instances, each can be connected to bus 706 by one or more data media interfaces. As will be further depicted and described below, memory 704 may include at least one program product having a set (e.g., at least one) of program modules that are configured to carry out the functions of embodiments of the invention.

Program/utility 714, having a set (at least one) of program modules 716, may be stored in memory 704 by way of example, and not limitation, as well as an operating system, one or more application programs, other program modules, and program data. Each of the operating system, one or more application programs, other program modules, and program data or some combination thereof, may include an implementation of a networking environment. Program modules 716 generally carry out the functions and/or methodologies of embodiments of the invention as described herein.

The computer system/server 700 may also communicate with one or more external devices 718 such as a keyboard, a pointing device, a display 720, etc.; one or more devices that enable a user to interact with computer system/server 700; and/or any devices (e.g., network card, modem, etc.) that enable computer system/server 700 to communicate with one or more other computing devices. Such communication can occur via Input/Output (I/O) interfaces 714. Still yet, computer system/server 700 may communicate with one or more networks such as a local area network (LAN), a general wide area network (WAN), and/or a public network (e.g., the Internet) via network adapter 722. As depicted, network adapter 722 may communicate with the other components of computer system/server 700 via bus 706. It should be understood that although not shown, other hardware and/or software components could be used in conjunction with computer system/server 700. Examples, include, but are not limited to: microcode, device drivers, redundant processing units, external disk drive arrays, RAID systems, tape drives, and data archival storage systems, etc.

Additionally, the encoding detection system 600 for determining encoding used for a sequence of bytes may be attached to the bus system 706.

The descriptions of the various embodiments of the present invention have been presented for purposes of illustration, but are not intended to be exhaustive or limited to the embodiments disclosed. Many modifications and variations will be apparent to those of ordinary skills in the art without departing from the scope and spirit of the described embodiments. The terminology used herein was chosen to best explain the principles of the embodiments, the practical application or technical improvement over technologies found in the marketplace, or to enable others of ordinary skills in the art to understand the embodiments disclosed herein.

The present invention may be embodied as a system, a method, and/or a computer program product. The computer program product may include a computer readable storage medium (or media) having computer readable program instructions thereon for causing a processor to carry out aspects of the present invention.

The medium may be an electronic, magnetic, optical, electromagnetic, infrared or a semi-conductor system for a propagation medium. Examples of a computer-readable medium may include a semi-conductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W), DVD and Blu-Ray-Disk.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus', and/or another devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus', or another device to cause a series of operational steps to be performed on the computer, other programmable apparatus or other device to produce a computer implemented process, such that the instructions which execute on the computer, other programmable apparatus', or another device implement the functions/acts specified in the flowchart and/or block diagram block or blocks.

The flowcharts and/or block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to limit the invention. As used herein, the singular forms "a", "an" and "the" are intended to include the plural forms as well, unless the context clearly indicates otherwise. It will further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements, as specifically claimed. The description of the present invention has been presented for purposes of illustration and description, but is not intended to be exhaustive or limited to the invention in the form disclosed. Many modifications and variations will be apparent to those of ordinary skills in the art without departing from the scope and spirit of the invention. The embodiments are chosen and described in order to best explain the principles of the invention and the practical application, and to enable others of ordinary skills in the art to understand the invention for various embodiments with various modifications, as are suited to the particular use contemplated.

What is claimed is:

1. A computer system for determining an encoding used for a sequence of bytes, the computer system comprising:
   one or more computer micro-processors:
   one or more non-transitory computer-readable storage media;
     program instructions stored on the computer-readable storage media for execution by at least one of the one or more processors, the program instructions comprising:
   instructions to provide a set of candidate code pages adapted for decoding a sequence of bytes, wherein the sequence of bytes comprises one or more successions of digitally encoded characters;
   instructions to transform the sequence of bytes into different groups of sequences of bytes based on the set of candidate code pages, wherein each code point within the sequences of bytes is transformed to a reference code point value relating to a reference encoding for each code point;
   instructions to separate each of the transformed sequences of bytes into groups of tokens, wherein the group of tokens relates to one candidate code page;
   instructions to provide an index relating to a text corpus, wherein the index comprises a set of tokens in said reference encoding; and
   instructions to select a code page within the set of candidate code pages at least partially based on a number of token relating to one of the set of candidate code pages is found in said index, wherein the search for selecting the code page within the set of candidate code pages is interrupted when the number of tokens relating to the code page exceeds a threshold value.

2. The system of claim 1, wherein the instructions to select a code page that code is based on a maximum number of matches between the group of tokens and the index.

3. The system of claim 1, wherein members of the set of candidate code pages are chosen based on at least one out of a detected code page family, a frequently used code page, a code page of a used operating system, a code page used before by a same originator of the sequence of bytes, and a code page of a comparable sequence of bytes.

4. The system of claim 1, wherein instructions to provide a set of candidate code pages comprises using candidate code pages from a same code page family.

5. The system of claim 1, wherein tokens that are different relative to a beginning of each of group are compared to the index.

6. The system of claim 1, wherein tokens that are equal in a same position relative to a beginning of each of said group of tokens, are committed to the index.

7. The system of claim 1, wherein a predefined number of tokens is used for the instruction to select a code page.

8. The system of claim 1, wherein the instructions to selecting the code page comprises:
   instructions to use that candidate code page corresponding to that group of tokens which code point values in the reference encoding belong all to a same character block; and
   instructions to terminate the selecting said code page.

9. The system of claim 8, wherein
   instructions to provide a set of candidate code pages comprises instructions to provide a primary candidate code page and one or more secondary candidate code pages; and
   wherein in the instructions to transform the sequence of bytes into different groups of sequences of bytes by using said the of candidate code pages the set of code pages is limited to the primary candidate code page, and
   in case in the instructions to select a code page from the set of candidate code pages, the primary candidate code page is instructed to be selected because a respective token is found in said index, an occurrence count is increased.

10. A computer program product for determining encoding used for a sequence of bytes, comprising a non-transitory computer-readable storage medium having program code embodied therewith, the program code executable by a processor of a computer to perform a method comprising:
   providing a set of candidate code pages adapted for decoding a sequence of bytes, wherein the sequence of bytes comprises one or more successions of digitally encoded characters;
   transforming the sequence of bytes into different groups of sequences of bytes based on the set of candidate code pages, wherein each code point within the sequences of bytes is transformed to a reference code point value relating to a reference encoding for each code point;
   separating each of the transformed sequences of bytes into groups of tokens, wherein the group of tokens relates to one candidate code page;
   providing an index relating to a text corpus, wherein the index comprises a set of tokens in said reference encoding; and
   selecting a code page within the set of candidate code pages at least partially based on a number of token relating to one of the set of candidate code pages is found in said index, wherein the search for selecting the code page within the set of candidate code pages is interrupted when the number of tokens relating to the code page exceeds a threshold value.

* * * * *